(12) United States Patent
Nishijima et al.

(10) Patent No.: US 8,426,544 B2
(45) Date of Patent: Apr. 23, 2013

(54) ENCAPSULATING MATERIAL FOR SOLAR CELL

(75) Inventors: Koichi Nishijima, Ichihara (JP); Akira Yamashita, Chiyoda-ku (JP)

(73) Assignees: Du-Pont Mitsui Polychemicals, Co., Ltd., Tokyo (JP); Mitsui Chemicals Tohcello, Inc., Tokyo (JP)

( * ) Notice: Subject to any disclaimer, the term of this patent is extended or adjusted under 35 U.S.C. 154(b) by 0 days.

(21) Appl. No.: 12/861,187

(22) Filed: Aug. 23, 2010

(65) Prior Publication Data
US 2010/0313956 A1 Dec. 16, 2010

Related U.S. Application Data

(62) Division of application No. 11/794,353, filed as application No. PCT/JP2005/023882 on Dec. 27, 2005, now abandoned.

(30) Foreign Application Priority Data

Dec. 28, 2004 (JP) ................................ 2004-381061
Dec. 28, 2004 (JP) ................................ 2004-381109

(51) Int. Cl.
*C08F 210/00* (2006.01)
*H01L 31/00* (2006.01)

(52) U.S. Cl.
USPC ........................................ 526/348; 136/259

(58) Field of Classification Search .................. 526/351, 526/348, 160; 252/501.1, 519.33; 136/259
See application file for complete search history.

(56) References Cited

U.S. PATENT DOCUMENTS

| 6,084,048 A | * | 7/2000 | Hozumi et al. | ............ 526/348.6 |
| 6,906,155 B1 | | 6/2005 | Minami et al. | |
| 2002/0038664 A1 | | 4/2002 | Zenko et al. | |

FOREIGN PATENT DOCUMENTS

| EP | 0842955 A2 | 5/1998 |
| EP | 1095951 A1 | 5/2001 |
| JP | 58-023870 | * 2/1983 |
| JP | 58023870 A | * 2/1983 |
| JP | 59-138234 A | 8/1984 |
| JP | 2-40709 B2 | 9/1990 |
| JP | 09-309982 A | 12/1997 |
| JP | 9-309982 A | 12/1997 |
| JP | 2000-068543 A | 3/2000 |
| JP | 2000-186114 A | 7/2000 |
| JP | 2001-119056 A | 4/2001 |
| JP | 2001-332750 A | 11/2001 |
| JP | 2003-049030 A | 2/2003 |
| JP | 2004-167905 A | 6/2004 |
| JP | 2004-268501 A | 9/2004 |

* cited by examiner

*Primary Examiner* — Hui Chin

(74) *Attorney, Agent, or Firm* — Buchanan Ingersoll & Rooney PC

(57) ABSTRACT

A solar cell encapsulated with an encapsulating material which is a non-crystalline or low-crystalline α-olefin-based copolymer or its composition (I). The composition (C) can contain 50 to 100 parts by weight of non-crystalline α-olefin polymer (A) which meets the following requirements: (a) the α-olefin having 3 to 20 carbon atoms is not less than 20 mol %, (b) practically no melt peak as measured by a differential scanning calorimeter is observed, and (c) the Mw/Mn is not more than 5, and 50 to 0 parts by weight of crystalline α-olefin polymer (B) (the total of (A) and (B) being 100 parts by weight). The non-crystalline or low-crystalline α-olefin copolymer may also have a crystallinity of not higher than 40% as measured by use of X rays.

7 Claims, No Drawings

ENCAPSULATING MATERIAL FOR SOLAR CELL

The present application is a Divisional application of U.S. application Ser. No. 11/794,353, filed Jun. 28, 2007, which is the National Stage of International Application No. PCT/JP2005/023882, filed Dec. 27, 2005, and claims foreign priority to Japanese Application No. 2004-381061, filed Dec. 28, 2004, and Japanese Application No. 2004-381109, filed Dec. 28, 2004, the entire contents of each of which are incorporated by reference herein.

TECHNICAL FIELD

The present invention relates to an encapsulating material for solar cells in solar cell modules and solar cell modules using the encapsulating material. More specifically, the present invention is concerned with encapsulating material for solar cells having excellent transparency, heat resistance, flexibility and other properties that makes the formation of solar cell modules easy.

BACKGROUND ART

Hydraulic power generation, wind power generation and photovoltaic power generation which make use of inexhaustible natural energy and help reduce carbon dioxide and improve other environmental problems are getting into the limelight. Out of these, the spread of photovoltaic power generation has been making remarkable progress in recent years as the performance of solar cell modules in power generation efficiency and other respects has been making marked improvements while on the other hand their prices have been declining and the national and local governments has been promoting the business of introducing photovoltaic power generation systems for household use. However, further spread of photovoltaic power generation will require further cost reductions, and to this end research is being continued night and day to work on the improvement of power generation efficiency.

A solar cell module is generally a package formed by protecting a solar cell comprising such solar cell element as silicon, gallium-arsenic and copper-iridium-selenium with a top transparent protective material and a bottom protective substrate material, with the solar cell and the protective materials fixed by use of an encapsulating material. For this reason, any encapsulating material for solar cells is required to have satisfactory transparency so that power generation efficiency will be increased. Encapsulating material for solar cells is also required to have heat resistance so that any troubles such as the flow or deformation of the encapsulating material will not occur even when the temperature rises during the use of the solar cell module. Furthermore, in recent years, as the wall thickness of solar cell element is becoming smaller, encapsulating materials having excellent flexibility are also sought after.

At present, an ethylene-vinyl acetate copolymer having a high vinyl acetate content is used for the encapsulating materials for solar cells in solar cell modules from the viewpoint of flexibility, transparency and other properties. However, because of its inadequate heat resistance, it is necessary to use organic peroxide additionally for such ethylene-vinyl acetate copolymer. For this reason, it is necessary to use a two-step process in which a sheet-like encapsulating material is first prepared from an ethylene-vinyl acetate copolymer containing an organic peroxide and then a solar cell element is sealed with the sheet thus obtained. In the step of making the sheet, it is necessary to mold the sheet at such low temperature that will not cause the decomposition of the organic peroxide and as a result it is impossible to increase the extrusion rate. On top of that, in the step of sealing the solar cell element, it is commonly necessary to carry out a time-consuming two-step bonding process which comprises a step of preliminarily bonding the solar cell over several minutes to score of minutes by use of a laminator and then a step of firmly bonding it over scores of minutes to one hour in an oven at a high temperature at which the organic peroxide is decomposed. Consequently, it is troublesome and requires much time to produce a solar cell module, which in turn constitutes a factor in increasing the manufacturing cost.

Reference 1: Japanese Patent Publication SHO 2-40709

DISCLOSURE OF THE INVENTION

Problems to Be Solved by the Invention

The present invention provides encapsulating material for solar cells showing excellent transparency, heat resistance, flexibility and other properties. The present invention provides encapsulating material for solar cells which without requiring the use of any organic peroxide makes possible a significant improvement in the efficiency in the production of solar cell modules and a substantial reduction in the manufacturing cost of solar cell modules.

The use of the non-crystalline or low-crystalline α-olefin-based copolymer of the present invention or its composition (I) makes it possible to provide encapsulating material for solar cells that will prevent an occurrence of such troubles as the flow or deformation of the encapsulating material and an impairment of the appearance of the solar cell even when the temperature rises during the use of the solar cell module. Specifically, the present invention makes it possible to provide encapsulating material for solar cells which shows a melting point of not lower than 85° C., a storage elastic modulus of not less than $10^3$ Pa at 150° C., Shore D hardness of not more than 60, and haze at a thickness of 0.5 mm of not more than 10%.

The present invention also provides an embodiment in which the non-crystalline or low-crystalline α-olefin-based copolymer or its composition (I) is a copolymer comprising ethylene as the main component and is cross-linked by the compounding of a cross-linking agent. In this case as well, such non-crystalline or low-crystalline α-olefin-based copolymer or its composition makes it possible to form encapsulating material for solar cells layer showing excellent flexibility and provide encapsulating material for solar cells that makes a reduction in the wall thickness of the solar cell possible.

The present invention provides a solar cell module using the solar cell encapsulating material of the present invention.

Means to Solve the Problems

The present invention provides encapsulating material for solar cells comprising a non-crystalline or low-crystalline α-olefin-based copolymer or its composition (I).

The present invention provides encapsulating material for solar cells as claimed in Claim 1, wherein the aforementioned copolymer or its composition (I) is resin composition (C) containing 50 to 100 parts by weight of non-crystalline α-olefin polymer (A) meeting the following requirements (a) to (c) and 50 to 0 parts by weight of crystalline α-olefin polymer (B) (the total of (A) and (B) being 100 parts by weight):

(a) The polymerization unit based on α-olefin having 3 to 20 carbon atoms is not less than 20 mol %.
(b) Practically no melt peak as measured by a differential scanning calorimeter is observed.
(c) The Mw/Mn is not more than 5.

The present invention also provides encapsulating material for solar cells as claimed in Claim 1, wherein the aforementioned copolymer or its composition (I) is a non-crystalline or low-crystalline α-olefin copolymer (D) having a crystallinity of not higher than 40% as measured by use of X rays.

Encapsulating material for solar cells, wherein at least one kind of additives selected from among cross-linking agents, cross-linking aids, silane-coupling agents, antioxidants, ultraviolet absorbers and light stabilizers is compounded to the aforementioned copolymer or its composition (I) is a preferable embodiment of the present invention.

Encapsulating material for solar cells, wherein the storage elastic modulus at 150° C. of the aforementioned copolymer or its composition (I) is not lower than $10^3$ Pa is a preferable embodiment of the present invention.

The present invention also provides a solar cell module that can be obtained by using any of the aforementioned solar cell encapsulating materials.

The present invention also provides a solar cell module, wherein the aforementioned solar cell encapsulating material layer is cross-linked.

Effect of the Invention

The present invention provides encapsulating material for solar cells having excellent transparency, heat resistance, flexibility and other properties.

The present invention provides encapsulating material for solar cells which without requiring the use of any organic peroxide makes possible a significant improvement in the efficiency in the production of solar cell modules and a substantial reduction in the manufacturing cost of solar cell modules.

According to the present invention, the use of the non-crystalline or low-crystalline α-olefin-based copolymer of the present invention or its composition (I) makes it possible to provide encapsulating material for solar cells that will prevent an occurrence of such troubles as the flow or deformation of the encapsulating material and an impairment of the appearance of the solar cell even when the temperature rises during the use of the solar cell module.

The present invention provides a solar cell module using the solar cell encapsulating material of the present invention which shows excellent performance.

BEST EMBODIMENTS OF THE INVENTION

An explanation is given of encapsulating material for solar cells comprising the non-crystalline or low-crystalline α-olefin-based copolymer of the present invention or its composition (I).

Given below are preferable examples of the non-crystalline or low-crystalline α-olefin-based copolymer of the present invention or its composition (I). As the first example, resin composition (C) containing 50 to 100 parts by weight of non-crystalline α-olefin polymer (A) meeting the following requirements (a) through (c) and 50 to 0 parts by weight of crystalline α-olefin polymer (B) (the total of (A) and (B) being 100 parts by weight) can be cited:
(a) The polymerization unit based on α-olefin having 3 to 20 carbon atoms is not less than 20 mol %.
(b) Practically no melt peak as measured by a differential scanning calorimeter is observed.
(c) The Mw/Mn is not more than 5.

The non-crystalline α-olefin polymer (A) that is used in the present invention is a polymer containing not less than 20%, preferably not less than 30%, of the monomer unit based on an α-olefin having 3 to 20 carbon atoms, with the content of all monomer units taken as 100 mol %. If the aforementioned content of the monomer unit is too low, polymer (A) may show inferior transparency and bleed resistance in some cases. Especially in the light of heat resistance and transparency, a polymer having the propylene unit content of not less than 30%, preferably not less than 50%, particularly preferably not less than 80%, is preferably used. Examples of the aforementioned α-olefin having 3 to 20 carbon atoms include straight-chain α-olefins such as propylene, 1-butene, 1-pentene, 1-hexene 1-heptene, 1-octene, 1-nonene, 1-decene, 1-undecene, 1-dodecene, 1-tridecene, 1-tetradecene, 1-pentadecene, 1-hexadecene, 1-heptadecene, 1-octadecene, 1-nanodecene and 1-eicocene and branched α-olefin such as 3-methyl-1-butene, 3-methyl-1-pentene, 4-methyl-1-pentene, 2-ethyl-1-hexene and 2,2,4-trimethyl-1-pentene. These may be used in combination of two more of them.

The non-crystalline α-olefin polymer (A) may contain monomer units other than the α-olefins having 3 to 20 carbon atoms. As examples of such monomers, ethylene, polyen compounds, cyclic olefins and vinyl aromatic compounds, for example, may be cited. The content of such monomer is preferably not higher than 70 mol %, more preferably not higher than 50 mol %, particularly preferably not higher than 20 mol %, wherein the total content of all monomer in the non-crystalline α-olefin polymer refers as 100%.

The non-crystalline α-olefin polymer (A) is preferably propylene homopolymer, propylene-ethylene copolymer, copolymer of α-olefin other than propylene and propylene, copolymer of α-olefin other than propylene, propylene and ethylene, more preferably propylene homopolymer, propylene-ethylene copolymer, propylene-1-butene copolymer, propylene-1-hexene copolymer, propylene-ethylene-1-butene copolymer, propylene-ethylene-1-hexene copolymer, further preferably propylene-1-butene copolymer, propylene-ethylene-1-butene copolymer, most preferably propylene-1-butene copolymer. The aforementioned polymers may be used singly or in combination of not less than two of them.

The non-crystalline α-olefin polymer (A) is a polymer whose melt peak is not practically observed when tested by a differential scanning calorimeter (DSC). A polymer whose melt peak is observed shows unsatisfactory transparency in some cases.

For the non-crystalline α-olefin polymer (A), an α-olefin polymer whose molecular weight distribution (Mw/Mn), a ratio between the weight-average molecular weight (Mw) and number-average molecular weight (Mn) which are measured by gel-permeation chromatography (GPC) with the standard polystyrene used as the molecular weight standard substance, is not more than 5, preferably 1 to 4, is also used. If an α-olefin polymer whose molecular weight distribution is too large, the bleed resistance, transparency or other properties may be unsatisfactory in some cases.

The non-crystalline α-olefin polymer (A) having such properties as mentioned above can be manufactured by the slurry polymerization process, solution polymerization process, mass polymerization process, gas-phase polymerization process, etc. using a metallocene catalyst. Examples of such metallocene catalyst include those metallocene catalysts disclosed in Japanese Laid-open Patent Applications SHO 58-19309, SHO 60-35005, SHO 60-35006, SHO 60-35007, SHO 60-35008, SHO 61-130314, HEI 3-163088, HEI 4-268307, HEI 9-12790, HEI 9-87313, HEI 10-508055, HEI 11-80233 and Japanese publication of International Application HEI 10-508055. As a particularly preferably example of the manufacturing process using a metallocene catalyst, a process disclosed in European Patent Publication No. 1211287 can be cited.

In the present invention, the crystalline α-olefin polymer (B) which can be used together with non-crystalline α-olefin polymer (A) is a polymer or copolymer of an α-olefin having 2 to 10 carbon atoms whose crystallinity as measured by use of X rays is not lower than 30%. In view of the compatibility with non-crystalline α-olefin polymer (A), transparency, heat resistance, etc., the use of propylene homopolymer or random copolymer of propylene and another α-olefin at a low ratio is preferable. Examples of the α-olefin in such random copolymer include α-olefins having 2 to 10 carbon atoms such as ethylene, 1-butene, 4-methyl-1-pentene, 1-hexene and 1-octene. Out of these, ethylene and/or 1-butene is preferable. The random copolymer preferably has the above α-olefin content of not higher than 10 wt %. The aforementioned propylene homopolymer or random copolymer of propylene is a homopolymer or random copolymer preferably showing a melt peak of 120° C. to 170° C., particularly preferably 150° C. to 170° C., as measured by a differential scanning calorimeter (DSC) from the viewpoint of heat resistance.

Such propylene homopolymer or random copolymer of propylene and another α-olefin at a low ratio can be produced by polymerizing propylene or copolymerizing propylene and α-olefin in the presence of a stereoregular olefin polymerization catalyst containing a titanium- or metallocene-based transition metal compound component, an organic aluminum component, and as required, an electron donor, a support, etc.

The solar cell encapsulating material of the present invention uses resin composition (C) which comprises 50 to 100, preferably 60 to 99, more preferably 70 to 95, parts by weight of the aforementioned non-crystalline α-olefin polymer (A) and 50 to 0, preferably 40 to 1, more preferably 30 to 5, parts by weight of the aforementioned crystalline α-olefin polymer (B) (the total of (A) and (B) being 100 parts by weight). For resin component (C), the kinds and compounding ratios of (A) and (B) should be preferably so selected that it will show a melt peak (as measured by a differential scanning calorimeter) of 120° C. to 170° C., preferably 150° C. to 170° C., which is attributable to crystalline α-olefin polymer (B), storage elastic modulus at 150° C. of not lower than $10^3$ Pa, JIS A hardness of 40 to 100, preferably 50 to 90, and haze of not higher than 10%, preferably not higher than 5%, at the sheet thickness of 0.5 mm.

As the second preferable example of the non-crystalline or low-crystalline α-olefin-based copolymer of the present invention or its composition (I), the non-crystalline or low-crystalline α-olefin-based copolymer (D) whose crystallinity as measured by use of X rays is not higher than 40% can be cited.

The non-crystalline or low-crystalline α-olefin-based copolymer (D) which is used as the encapsulating material of the present invention is a copolymer having rubber properties which uses not less than two kinds of α-olefin having 2 to 10 carbon atoms as the components and shows crystallinity of not higher than 40% (0 to 40%) as measured by the X-ray diffraction method. From the viewpoint of heat resistance, a copolymer showing crystallinity of approximately 1 to 40%, such as a copolymer falling under the category of what is called low-crystalline copolymers, is preferably used rather than a completely non-crystalline copolymer. However, any copolymer comprising ethylene as the main component that is compounded with an organic peroxide may be of the completely crystalline type (crystallinity: 0).

A representative example of such copolymer (D) is a copolymer which comprises ethylene or propylene as the main component, one or two or more other α-olefins having 2 to 10 carbon atoms as the accessory components and as required a small amount of diene monomer.

Examples of the copolymers comprising ethylene as the main component include those copolymers which contain a 50 to 90 mol %, preferably 70 to 85 mol %, ethylene polymerization unit, a 50 to 10 mol %, preferably 30 to 15 mol % polymerization unit of α-olefins other than ethylene, and as required not higher than 2 mol %, preferably not higher than 1 mol %, diene monomer polymerization unit. Examples of such ethylene-based copolymers include ethylene-propylene copolymer, ethylene-1-butene copolymer, ethylene-4-methyl-1-pentene copolymer, ethylene-1-hexene copolymer, ethylene-1-octene copolymer, ethylene-propylene-dicychlopentadiene copolymer, ethylene-propylene-5-ethylydene-2-norbornene copolymer, and ethylene-propylene-1,6-hexadiene copolymer. Out of these, ethylene-propylene copolymer, ethylene-propylene-diene copolymer or ethylene-1-butene copolymer are particularly preferable.

Furthermore, examples of the copolymers comprising propylene as the main component include those copolymers which contain a 70 to 95 mol %, preferably 72 to 90 mol %, propylene polymerization unit, and a 5 to 30 mol %, preferably 10 to 28 mol % polymerization unit of α-olefins other than propylene. Examples of such propylene-based copolymers include propylene-ethylene copolymer and propylene-1-butene copolymer.

For the aforementioned non-crystalline or low-crystalline α-olefin-based copolymer (D), those α-olefin-based copolymers which have a melt flow rate (MFR) of 0.1 to 50, preferably 0.5 to 20, g/10 minutes, as measured at 230° C. under a load of 2,160 g by the method based on ASTM D-1238 is preferably used from the viewpoint of moldability, mechanical strength and other properties.

When the aforementioned non-crystalline or low-crystalline α-olefin-based copolymer (D) is a copolymer comprising ethylene as the main component, it can be manufactured by copolymerizing ethylene and other α-olefins in the presence of a vanadium catalyst comprising a soluble vanadium compound and an organic aluminum halide, or metallocene catalyst comprising a metallocene compound such as a cyclopentadienyl-coordinated zirconium compound and an organic aluminumoxy compound. Furthermore, in the case of a copolymer comprising propylene as the main component, it can be manufactured by copolymerizing propylene and other α-olefins in the presence of a stereoregular olefin polymerization catalyst containing a transition metal compound component such as a high-activity titanium catalyst component or a metallocene catalyst component, an organic aluminum component, and as required an electron donor, a support, etc.

In using the α-olefin-based copolymer of the present invention as encapsulating material for solar cells, other polymers and various additives may be compounded to it as required. Specific examples of such additives include cross-linking agents, cross-linking aids, tackifiers, silane coupling agents, ultraviolet absorbers, hindered phenol-based and phosphite-based antioxidants, hindered amine-based light stabilizers, light diffusion agents, fire retardants, pigments (white pigment, for example), and anti-discoloration agents. In the present invention, there is normally no need for compounding a cross-linking agent or a cross-linking aid to the non-crystalline or low-crystalline α-olefin-based copolymer or its composition (I). However, if a high degree of heat resistance is required, a cross-linking agent or a cross-linking agent and an aid may be compounded. The compounding of these makes it possible to cross-link the non-crystalline or low-crystalline α-olefin-based copolymer or its composition (I) with the encapsulating material incorporated into a solar cell in such manner that the encapsulating material is in contact with the solar cell and to endow the solar cell with such heat resistance that will prevent the encapsulating material from melting and flowing when the solar cell is used at high temperature, while maintaining the transparency of the encapsulating material layer.

For usable cross-linking agents, organic peroxides the decomposition temperature (a temperature at which the half-life period is one hours) of which is 70° C. to 180° C., particularly 90° C. to 160° C. are preferably used. Examples of such organic peroxides include tertiary butyl peroxy isopropyl carbonate, tertiary butyl peroxy acetate, tertiary butyl peroxy benzoate, dicumyl peroxide, 2,5-dimethyl-2,5-bis (tertiary butyl peroxy)hexane, ditertiary butyl peroxide, 2,5-dimethyl-2,5-bis(tertiary butyl peroxy)hexine-3,1,1-bis(tertiary butyl peroxy)-3,3,5,-trimethyl cyclohexane, 1,1-bis (tertiary butyl peroxy)cyclohexane, methylethylketone peroxide, 2,5-dimethylhexyl-2,5-bisperoxybenzoate tertiary butyl hydroperoxide, p-methane hydroperoxide, benzoyl peroxide, p-chlorobenzoyl peroxide, tertiary butyl peroxyisobutylate, hydroxyheptyl peroxide, and dichlohexanon peroxide. An optimum compounding ratio of a cross-linking agent varies with the types of cross-linking agent, but a ratio of 0.1 to 5 parts by weight, particularly 0.5 to 3 parts by weight, per 100 parts by weight of the non-crystalline or low-crystalline α-olefin-based copolymer or its composition (I) is effective.

Cross-linking aids are effective in accelerating cross-linking reaction and raising the degree of the cross-linking of a non-crystalline α-olefin-based copolymer comprising ethylene as the main component. As specific examples of cross-linking aids, poly unsaturated compounds such as polyallyl compounds and poly(meth)acryloxy compounds can be cited. More specific examples include polyallyl compounds such as triallyl isocyanurate, triallyl cyanurate, diallyl phthalate, diallyl fumarate and diallyl maleate, poly(meth)acryloxy compounds such as ethylene glycol diacrylate, ethylene glycol dimethacrylate and trimethlol propane trimethacrylate, and divinyl benzene. It is effective for cross-linking aids to be compounded at a ratio of approximately 0.5 to 5 parts by weight to 100 part by weight of the non-crystalline or low-crystalline α-olefin-based copolymer or its composition (I).

Silane coupling agents are useful for improving the adhesion of the encapsulating material to the protective materials, solar cells, etc. As examples of silane coupling agents, compounds having hydrolysable groups such as the alkoxy group as well as unsaturated groups of the vinyl group, acryloxy group and methacryroxy group, the amino group and the epoxy group can be cited. Specific examples of silane coupling agents include N-(β-aminoethyl)-γ-aminopropyltrimethoxy silane, N-(β-aminoethyl)-γ-aminopropylmethyldimethoxy silane, γ-aminopropyltriethoxy methoxy silane, γ-glycidoxypropyltrimethoxy silane, and γ-methacryloxypropyl triethoxy silane. A silane coupling agent is preferably compounded at a ratio of 0.1 to 5 parts by weight against 100 parts by weight of the non-crystalline or low-crystalline α-olefin-based copolymer or its composition (I).

As examples of the ultraviolet absorbers that can be added to the solar cell encapsulating material of the present invention, benzophenon-based, benzotriazol-based, triazine-based, salicyclic ester-based and many other types can be cited. Examples of benzophenon-based ultraviolet absorbers include 2-hydroxy-4-methoxybenzophenone, 2-hydroxy-4-methoxy-2'-carboxybenzophenone, 2-hydroxy-4-octoxybenzophenone, 2-hydroxy-4-n-dodecyloxybenzophenone, 2-hydroxy-4-n-octadecyloxybenzophenone, 2-hydroxy-4-benzyloxybenzophenone, 2-hydroxy-4-methoxy-5-sulfobenzophenon, 2-hydroxy-5-chlorobenzophenone, 2,4-dihydroxybenzophenone, 2,2'-dihydroxy-4-methoxybenzophenone, 2,2'-dihyroxy-4-4'-dimethoxybenzophenone, and 2,2'-4,4'-tetrahydroxy benzophenone.

Examples of benzotriazol-based ultraviolet absorbers include hydroxyphenyl-substituted benzotriazol compound, such as 2-(2-hydroxy-5-methylphenyl)benzotriazol, 2-(2-hydroxy-5-t-butylphenyl)benzotriazol, 2-(2-hydroxy-3,5-t-dimethyl phenyl)benzotriazol, 2-(2-methyl-4-hydroxyphenyl)benzotriazol, 2-(2-hydroxy-3-methyl-5-t-butylphenyl) benzotriazol, 2-(2-hydroxy-3,5-di-t-amylphenyl) benzotriazol and 2-(2-hydroxy-3,5-di-t-butylphenyl) benzotriazol. Furthermore, examples of triazine-based ultraviolet absorbers include 2-[4,6-bis(2,4-dimethylphenyl)]-1,3,54-triazine-2-il]-5-(octyloxy)phenol, and 2-(4,6-diphenyl-1,3,5-tiazine-2-il)-5-(hexyloxy)phenol. Examples of salicyclic ester-based absorbers include phenylsalicylate and p-octylphenylsalicylate. The compounding amount of an ultraviolet absorber is preferably 0 to 2 parts by weight per 100 parts by weight of the non-crystalline or low-crystalline α-olefin-based copolymer or its composition (I).

Solar cell modules can be fabricated by using of the solar cell encapsulating material of the present invention and by fixing the solar cell element with top and bottom protective materials. As examples of such solar cell modules, various types can be cited. As examples of such solar cell modules, the following can be cited: a solar cell module in which a solar cell element is sandwiched on both sides by means of an encapsulating material in such manner as a top transparent protective material/encapsulating material/solar cell element/encapsulating material/bottom protective material, a solar cell module having such structure that an encapsulating material and a top transparent protective material are formed on a solar cell element formed on the inner circumference of the bottom substrate protective material, and a solar cell module in which an encapsulating material and a bottom transparent protective material are formed on a solar cell element formed on the inner circumference of the top transparent protective material, such as an amorphous solar cell element formed by sputtering or the like on the transparent fluororesin-based protective material.

As examples of solar cell elements, a wide variety of solar cell elements can be cited, including solar cells based on silicon such as single-crystal silicon, polycrystal silicon and amorphous silicon and solar cells based on III-V-Group and II-VI-Group compounds such as gallium-arsenic, copper-indium-selenium and cadmium-tellurium.

As examples of the top protective material making up solar cell modules, glass, acrylic resin, polycarbonate, polyester, fluorine-containing resin, etc. can be cited. The bottom protective material is a single-layer or multi-layer sheet made of metal or various thermoplastic resin film, including metals such as tin, aluminum and stainless steel, inorganic materials such as glass, and single-layer or multi-layer protective materials made of polyester, inorganic compound vapor deposition polyester, fluorine-containing resin and polyolefin, for example. Primer treatment may be done to top and/or bottom protective materials in order to improve their adhesion with the encapsulating material.

The solar cell encapsulating material of the present invention is used normally in the form of a sheet approximately 0.1 to 1 mm in thickness. The solar cell encapsulating material in the form of a sheet can be manufactured by the sheet forming method known to the public using a T-die extruder, calendering equipment, and other equipment. For example, a cross-linking agent, cross-linking aid, silane coupling agent, ultraviolet absorber, antioxidant, light stabilizer, etc., which are added as required are dry-blended in advance with a non-crystalline or low-crystalline α-olefin-based copolymer or its composition (I), fed from the hopper of a T-die extruder, and extruded to form a sheet. Needless to say, at the time of such dry-blending, some or all of the additives may be used in the form of masterbatch.

In the case of the first specific example of the non-crystalline or low-crystalline α-olefin-based copolymer of the present invention or its composition (I), encapsulating material for solar cells in the form of a sheet which comprises resin composition (C) can be manufactured by the sheet forming method known to the public using a T-die extruder, calendering equipment. For example, such an encapsulating material can be formed by dry-blending crystalline α-olefin polymer (B), a silane coupling agent, an ultraviolet absorber, an antioxidant, a light stabilizer and other additives with non-crystalline α-olefin polymer (A) as required and feeding them from the hopper of a T-die extruder to extrude a sheet. It goes without saying that it is possible to melt and mix non-crystalline α-olefin polymer (A) and crystalline α-olefin polymer (B) in advance or to produce composition (C) of both α-olefin polymers by consecutive polymerization. At the time of such dry-blending, some or all of the additives may be used in the form of masterbatch.

In the case of the second specific example of the non-crystalline or low-crystalline α-olefin-based copolymer of the present invention or its composition (I), for example, a cross-linking agent, cross-linking aid, silane coupling agent, ultraviolet absorber, antioxidant, light stabilizer, etc., which are added as required are dry-blended in advance with a non-crystalline or low-crystalline α-olefin-based copolymer (D), fed from the hopper of a T-die extruder, and extruded to form a sheet. Needless to say, at the time of such dry-blending, some or all of the additives may be used in the form of masterbatch.

Furthermore, in the T-die extrusion or calendaring, it is also possible to use a resin composition obtained by melting and mixing some or all of the additives together with the non-crystalline or low-crystalline α-olefin-based copolymer or its composition (I) beforehand by use of a single-screw extruder, twin-screw extruder, Banbury mixer, kneader, etc.

In the manufacture of a solar cell module, it is possible to form a module of a structure as described above by the method same as the conventional method in which a sheet of the encapsulating material for solar cell of the present invention is prepared in advance and is press-bonded at a temperature at which the solar cell encapsulating material melts. In this case, if any organic peroxide is not compounded to the solar cell encapsulating material, the molding of a sheet of the solar cell encapsulating material can be carried out with high productivity at high temperature, and it is possible to complete the formation of a module in a short time and high temperature without having to go through a two-step bonding process in the formation of a module. Moreover, if a method in which a solar cell and the top protective material or the bottom protective material are laminated by extrusion-coating the solar cell encapsulating material of the present invention is adopted, there is no need to bother to mold a sheet, and it becomes possible to produce a solar cell module in a single step. Therefore, the use of the solar cell encapsulating material of the present invention makes it possible to improve productivity in the manufacture of modules substantially In the case of compound a peroxide to the solar cell encapsulating material, what has to be done is only to bond the solar cell encapsulating material tentatively to the solar cell and the protective materials at a temperature at which the cross-linking agent will not decompose but the encapsulating material for solar cell of the present invention will melt and then raise temperature to carry out the bonding of them adequately and the cross-linking of the non-crystalline or low-crystalline α-olefin-based copolymer. In this case, in order to ensure that a solar cell module with satisfactory heat resistance, showing the melting point (DSC method) of the solar cell encapsulating material of not lower than 85° C. and showing with the storage elastic modulus at 150° C. being not lower than $10^3$ Pa, the cross-linking of the non-crystalline or low-crystalline α-olefin-based copolymer should preferably be carried so that the gelation percent will be 50% to 98%, preferably 70% to 95% (by immersing 1 g of the sample in 100 ml of xylene, heating it for 24 hours at 110° C. and measuring the mass percent of the undissolved filtrate filtrated through a 20-mesh wire netting). Therefore, what has to be done is only to select those formations of the additives which meet these conditions and to select the types and compounding amounts of the additives, for example, properly.

EXAMPLES

Given below is a detailed explanation of the present invention using Examples. The present invention is not limited in any way by these Examples.

The physical properties of the present invention were determined by the following methods:

(1) Storage Elastic Modulus (E')

A 2-mm press-molded sheet was prepared under the conditions of 15 minutes at 150° C., and the storage elastic modulus of the sheet was determined at 150° C. under the following conditions:

Equipment: DVE-V4 available from UBM
Testing mode: Pulling
Sample size: 30 mm×5 mm
Frequency: 10 Hz
Rate of temperature rise: 3° C./min
Amplitude of vibration: 2 μm (2) Haze, Total Light Transmission A 0.5-mm sheet was sandwiched with two sheets of 3-mm blue glass and laminated for 15 minutes at 150° C. by use of a vacuum laminating machine. The haze and total light transmission were measured by a method based on JIS K7105.

(3) 60° Slanting Test

A 0.5-mm sheet was sandwiched with a 3-mm blue glass plate and an aluminum plate and laminated for 15 minutes at 150° C. by use of a vacuum laminating machine. The sample slanted at 60° at 100° C. and then was observed for 500 hours as to whether the sheet would melt and be brought into slippage from the glass.

(4) Gel Percent

A 1-mm press-molded sheet was prepared under the conditions of 30 minutes at 150° C., and approx. 1 g of the sheet was cut off and weighed accurately. The samples was immersed in 100 cc of xylene and treated for 24 hours at 110° C. After filtration, the residues were dried and weighed accurately. The gel percent was calculated by dividing the weight of the residues by the weight measured before the treatment.

Example 1

A sheet 0.5 mm in thickness was prepared at a processing temperature of 160° C. by use of a profile extruder (screw diameter: 40 mm; L/D=26; screw full flight: CR=2.6), using a resin composition comprising 85 parts by weight of a non-crystalline propylene polymer and 15 parts by weight of crystalline polypropylene (trade name: Toughcellene T3512; available from Sumitomo Chemical Co.; melt peak as measured by a differential scanning calorimeter; 158° C., JIS A hardness: 56). The physical properties of the resultant sheet were measured. Results are shown in Table 1.

TABLE 1

| Physical properties | Measurement value |
|---|---|
| Haze (%) | 6.8 |
| Total light transmission (%) | 83.2 |
| Storage elastic modulus (Pa) at 150° C. | $1.0 \times 10^6$ |
| 60° slanting test (100° C. × 1000 hrs) | No slippage/do discloration |

Example 2

A sheet 0.5 mm in thickness was prepared at a processing temperature of 160° C. by use of a profile extruder (screw diameter: 40 mm; L/D=26; screw full flight: CR=2.6), using a non-crystalline or low-crystalline propylene-butene copolymer (PBR) (available from Mitsui Chemicals, Inc.; a non-crystalline or low-crystalline α-olefin-based copolymer; trade name: TAFMER XR110T; melt flow rate (ASTM D1238): 3.2 g/10 min (190° C.), 6.0 g/10 min (230° C.); melting point: 110° C.; Shore D hardness: 56). The physical properties of the resultant sheet were measured. Results are shown in Table 2.

Example 3

A sheet 0.5 mm in thickness was prepared by the same method as described in Example 1 except that a mixture of the propylene-butene-1 copolymer and an alicyclic tackifier (trade name: Alcon AM-1; available from Arakawa Chemical Co.; softening point: 125° C.) in a weight ratio of 90:10 was used in place of the propylene-butene-1 copolymer of example 1. The physical properties of the resultant sheet were measured. Results are shown in Table 2.

Example 4

A sheet 0.5 mm in thickness was prepared at a processing temperature of 100° C. by use of a profile extruder (screw diameter: 40 mm; L/D=26; screw full flight: CR=2.6), using a mixture of 100 parts by weight of a non-crystalline or low-crystalline etylene-butene copolymer (EBR) (available from Mitsui Chemicals, Inc.; a non-crystalline or low-crystalline α-olefin-based copolymer; trade name: TAFMER A4085; melt flow rate (ASTM D1238): 3.6 g/10 min (190° C.), 6.7 g/10 min (230° C.); melting point: 72° C.; JIS A hardness: 84), 1.5 parts by weight of 2,5-dimethyl-2,5-di(t-butylperoxy)hexane as a cross-linking agent, and 2 parts by weight of triallylisocyanurate as a cross-linking aid. The physical properties of the resultant sheet were measured. Results are shown in Table 2.

Example 5

A sheet 0.5 mm in thickness was prepared by the same method as described in Example 4 except that the amount of the cross-linking agent was 1.2 parts by weight and the use of the cross-linking accelerator was omitted. The physical properties of the resultant sheet were measured. Results are shown in Table 2.

Example 6

A sheet 0.5 mm in thickness was prepared by the same method as described in Example 5 except that a non-crystalline or low-crystalline etylene-propylene copolymer (EPR) (available from Mitsui Chemicals, Inc.; a non-crystalline or low-crystalline α-olefin-based copolymer; trade name: TAFMER $PO_{275}$; melt flow rate (ASTM D1238): 2.5 g/10 min (190° C.); melting point: 30° C.; JIS A hardness: 56) was used in place of the ethylene-butene-1 copolymer. The physical properties of the resultant sheet were measured. Results are shown in Table 2.

TABLE 2

| | | Example 2 | Example 3 | Example 4 | Example 5 | Example 6 |
|---|---|---|---|---|---|---|
| Composition (parts by weight) | EBR | | | 100 | 100 | |
| | EPR | | | | | 100 |
| | PBR | 100 | 90 | | | |
| | Tackifier | | 10 | | | |
| | Cross-linking agent | | | 1.5 | 1.2 | 1.2 |
| | Cross-linking aid | | | 2 | | |
| pr | Haze (%) | 5.8 | 3.8 | 1.8 | 1.9 | 2.8 |
| | Total light transmission (%) | 87.1 | 87.2 | 90.4 | 90.4 | 90.1 |
| | Gelation percent (%) | — | — | 92 | 82 | 80 |
| | Storage elastic modulus (Pa) | $1.1 \times 10^5$ | $8.5 \times 10^4$ | $8.5 \times 10^4$ | $7.9 \times 10^4$ | $3.2 \times 10^4$ |
| | 60° slating test | No slippage/ discoloration | No slippage/ discoloration | No slippage/ discoloration | No slippage/ discoloration | No slippage/ discoloration |

POSSIBILITY OF INDUSTRIAL USE

The encapsulating material for solar cell that is provided by the present invention is encapsulating material for solar cells showing excellent transparency, heat resistance, flexibility, etc.

In the encapsulating material for solar cell that is provided by the present invention the use of an organic peroxide is not essential. For this reason, the encapsulating material for solar cell makes it possible to improve productivity in the solar cell module manufacturing process remarkably and reduce the solar cell module manufacturing cost substantially.

The encapsulating material for solar cell that is provided by the present invention has high storage elastic modulus at 150° C., low haze and proper hardness. This makes it possible to avoid troubles such as the flow or deformation of the solar cell encapsulating material and an impairment of the appearance even when the temperature rises during the use of the solar cell module obtained from the solar cell encapsulating material.

Furthermore, if a copolymer using ethylene as the main component is selected for the non-crystalline or low-crystalline α-olefin-based copolymer and a cross-linking agent is compounded to such copolymer, there will be no such advantage in the manufacturing process as described above but it will be possible to form encapsulating material for solar cells layer exhibiting excellent flexibility. This will make it possible to fully cope with modules of smaller wall thickness.

According to the present invention, the use of the solar cell encapsulating material of the present invention provides a solar cell module showing excellent performance.

The invention claimed is:

1. A solar cell module which is obtained by using a solar cell encapsulating material comprising a non-crystalline or low-crystalline α-olefin-based copolymer or its composition (I),
   wherein the non-crystalline or low-crystalline α-olefin-based copolymer or its composition (I) is a resin composition (C) containing 50 to 100 parts by weight of non-crystalline α-olefin polymer (A) meeting the following requirements (a) through (c) and 50 to 0 parts by weight of crystalline α-olefin polymer (B) (the total of (A) and (B) being 100 parts by weight):
   (a) a polymerization unit based on α-olefin having 3 to 20 carbon atoms is not less than 20 mol %;
   (b) practically no melt peak as measured by a differential scanning calorimeter is observed;
   (c) the Mw/Mn is not more than 5, and
   wherein the non-crystalline or low-crystalline α-olefin-based copolymer or its composition (I) does not contain a cross-linking agent or cross-linking accelerator.

2. The solar cell module according to claim 1, wherein propylene polymerization unit of the non-crystalline α-olefin polymer (A) is not less than 30 mol %.

3. The solar cell module according to claim 1, wherein the non-crystalline α-olefin polymer (A) is a polymer produced by use of a metallocene catalyst.

4. The solar cell module according to claim 1, wherein the crystalline α-olefin polymer (B) is a propylene homopolymer or a copolymer of propylene and another α-olefin.

5. The solar cell module according to claim 1, wherein the resin composition (C) is a composition having JIS A hardness of 40 to 100.

6. The solar cell module according to claim 1, wherein the haze of the copolymer at the thickness of 0.5 mm is not higher than 10%.

7. The solar cell module according to claim 1, wherein the solar cell encapsulating material is in the form of sheet.

* * * * *